United States Patent
Cheng et al.

(10) Patent No.: US 12,288,715 B2
(45) Date of Patent: Apr. 29, 2025

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Yi-Hua Cheng, Chiayi County (TW); Ya-Wen Chiu, Tainan (TW); Yi Che Chan, Hsinchu (TW); Lun-Kuang Tan, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 59 days.

(21) Appl. No.: 18/135,622

(22) Filed: Apr. 17, 2023

(65) Prior Publication Data

US 2023/0253246 A1 Aug. 10, 2023

Related U.S. Application Data

(62) Division of application No. 17/197,995, filed on Mar. 10, 2021, now Pat. No. 11,631,612.

(Continued)

(51) Int. Cl.
*H01L 21/768* (2006.01)
*H01L 21/02* (2006.01)
(Continued)

(52) U.S. Cl.
CPC .... *H01L 21/7682* (2013.01); *H01L 21/76831* (2013.01); *H01L 21/76832* (2013.01);
(Continued)

(58) Field of Classification Search
CPC .......... H01L 21/7682; H01L 21/76831; H01L 21/76832; H01L 21/0206; H01L 21/76804;
(Continued)

(56) References Cited

U.S. PATENT DOCUMENTS 10,971,408 B2 4/2021 Yeong et al.
2014/0117420 A1 5/2014 Chen et al.
(Continued)

FOREIGN PATENT DOCUMENTS

CN 111129148 A 5/2020
TW 201911425 A 3/2019

OTHER PUBLICATIONS

Notice of Allowance issued in U.S. Appl. No. 17/197,995, dated Dec. 13, 2022.

(Continued)

*Primary Examiner* — Thanhha S Pham
(74) *Attorney, Agent, or Firm* — STUDEBAKER BRACKETT PLLC

(57) ABSTRACT

In a method of manufacturing a semiconductor device, a source/drain structure is formed over a substrate, a first interlayer dielectric (ILD) layer including one or more dielectric layers is formed over the source/drain structure, a first opening is formed in the first ILD layer to at least partially expose the source/drain structure, a sacrificial layer is formed on an inner wall of the first opening, a first insulating layer is formed on the sacrificial layer, a conductive layer is formed on the first insulating layer so as to form a source/drain contact in contact with the source/drain structure, the sacrificial layer is removed to form a space between the first insulating layer and the first ILD layer, and a second insulating layer is formed over the source/drain contact and the first ILD layer to cap an upper opening the space, thereby forming an air gap.

20 Claims, 11 Drawing Sheets

Related U.S. Application Data

(60) Provisional application No. 63/030,153, filed on May 26, 2020.

(51) Int. Cl.
 *H01L 29/417* (2006.01)
 *H01L 29/45* (2006.01)
(52) U.S. Cl.
 CPC .... *H01L 21/0206* (2013.01); *H01L 21/76804* (2013.01); *H01L 29/41791* (2013.01); *H01L 29/456* (2013.01)
(58) Field of Classification Search
 CPC . H01L 29/4179; H01L 29/456; H01L 23/485; H01L 29/165; H01L 29/4991; H01L 29/66545; H01L 29/66795; H01L 29/785; H01L 21/76897; H01L 21/823475; H01L 21/823431; H01L 21/823821; H01L 21/823871; H01L 27/0886; H01L 27/0924; H01L 21/823418; H01L 21/823468
 See application file for complete search history.

(56) References Cited

U.S. PATENT DOCUMENTS

| | | |
|---|---|---|
| 2015/0035050 A1* | 2/2015 | Yeom ................ H01L 21/32133 257/532 |
| 2017/0018458 A1 | 1/2017 | Cheng et al. |
| 2017/0148914 A1 | 5/2017 | Lee et al. |
| 2017/0222008 A1* | 8/2017 | Hsu ................... H01L 21/76849 |
| 2018/0151378 A1 | 5/2018 | Huang et al. |
| 2018/0166553 A1 | 6/2018 | Lee et al. |
| 2019/0067442 A1 | 2/2019 | Lin et al. |
| 2019/0181223 A1 | 6/2019 | Tang |
| 2019/0206740 A1 | 7/2019 | Shroff et al. |
| 2019/0378909 A1 | 12/2019 | Cheng et al. |
| 2020/0105867 A1* | 4/2020 | Lee ..................... H01L 29/0649 |
| 2020/0127110 A1 | 4/2020 | Lee et al. |
| 2020/0135591 A1 | 4/2020 | Yeong et al. |
| 2020/0152761 A1 | 5/2020 | Cheng et al. |

OTHER PUBLICATIONS

Non-Final Office Action issued in U.S. Appl. No. 17/197,995, dated Jun. 9, 2022.

* cited by examiner

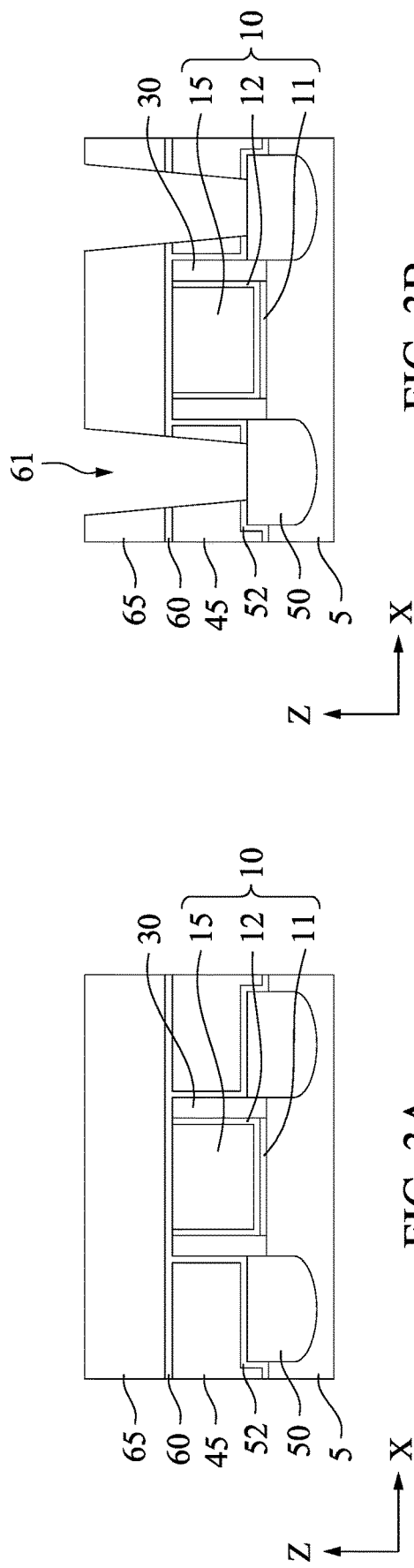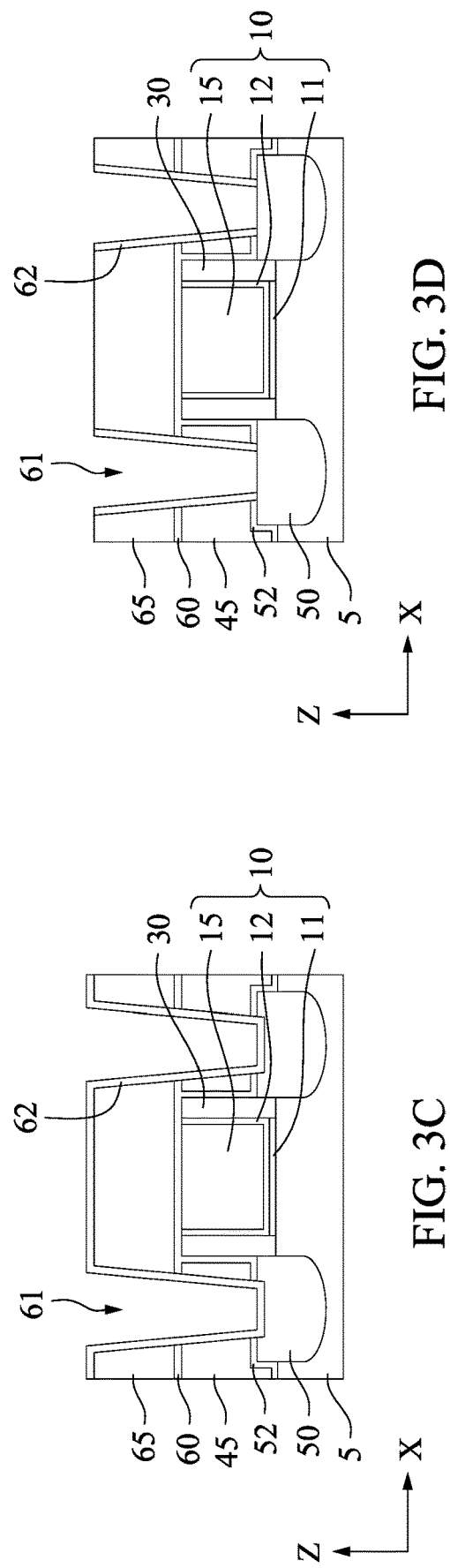

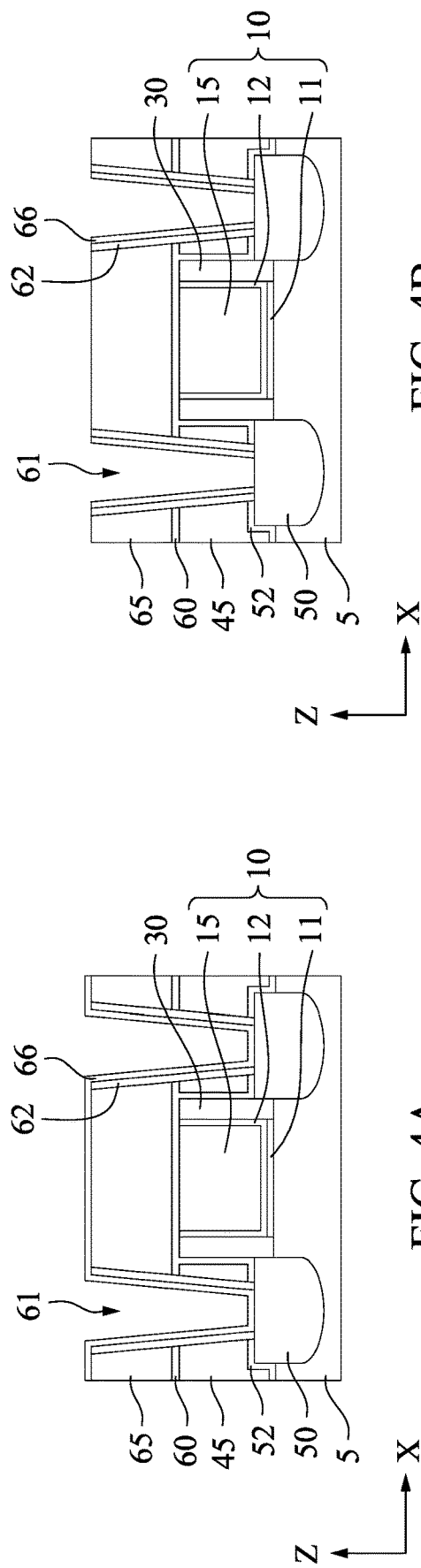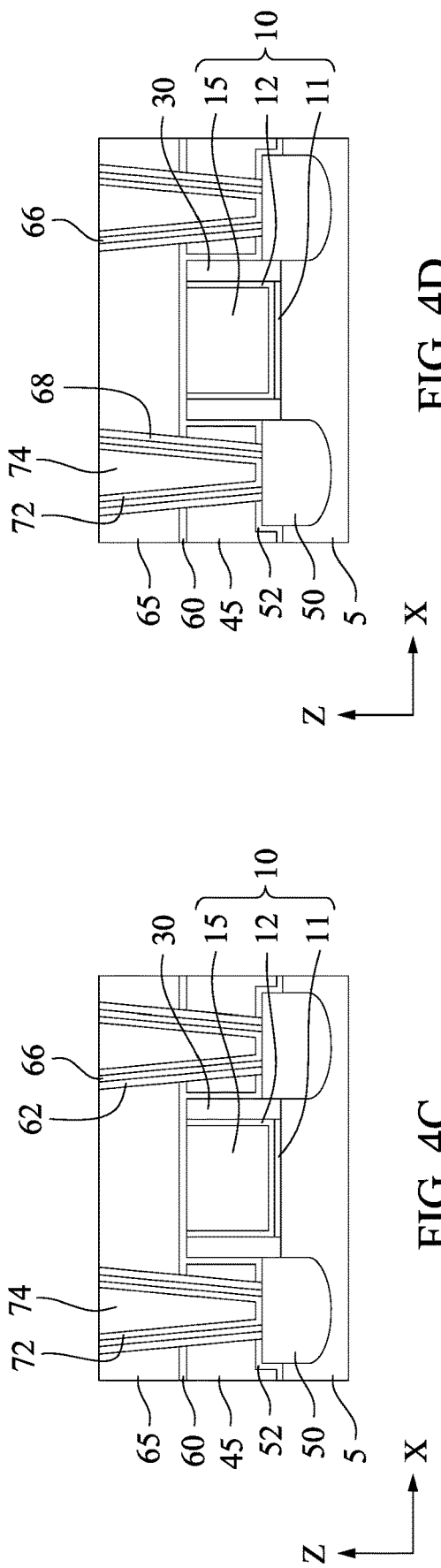

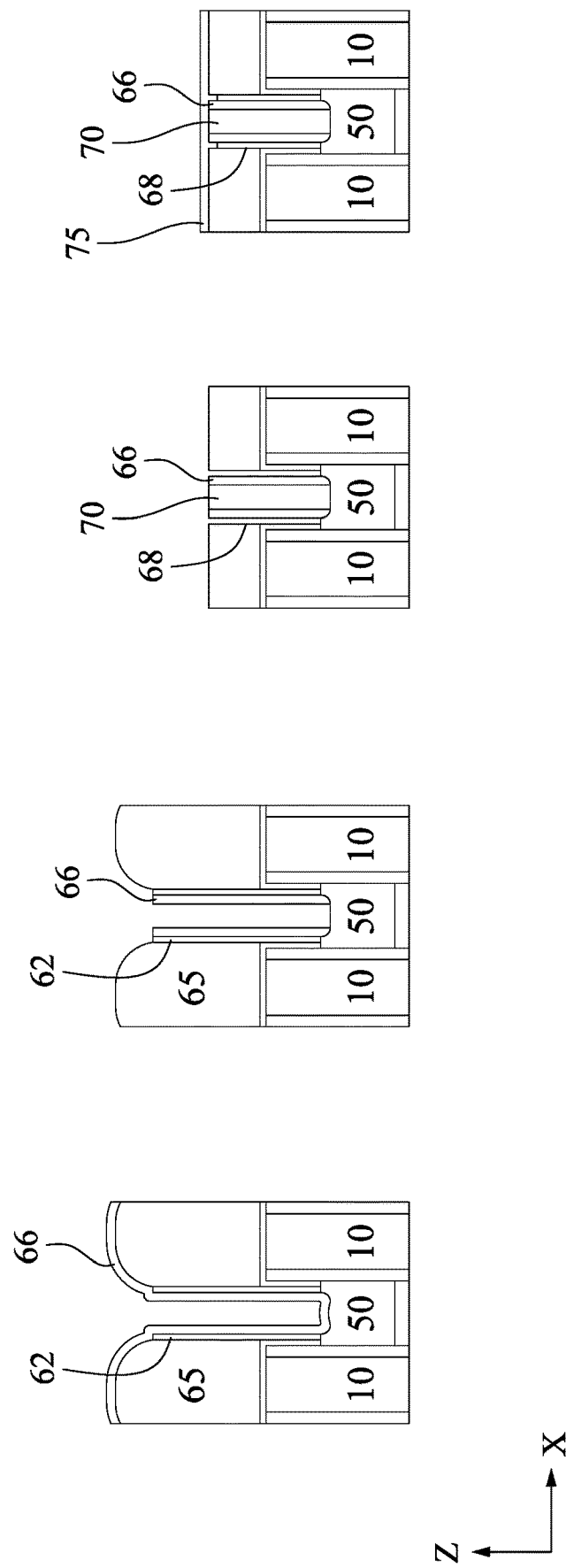

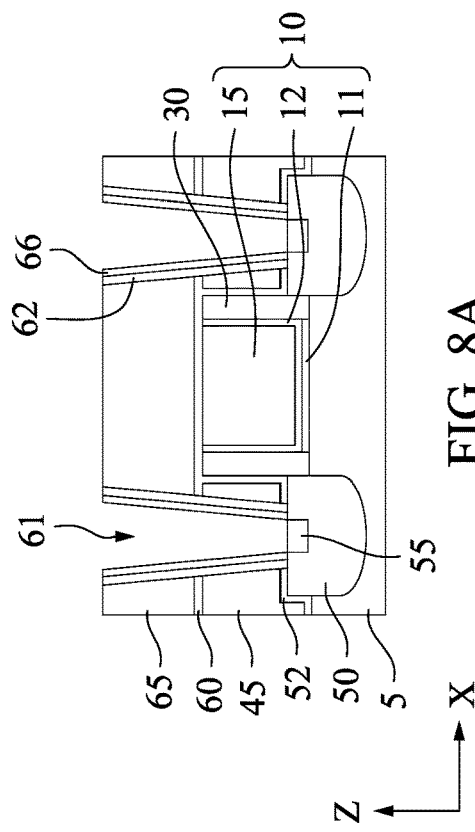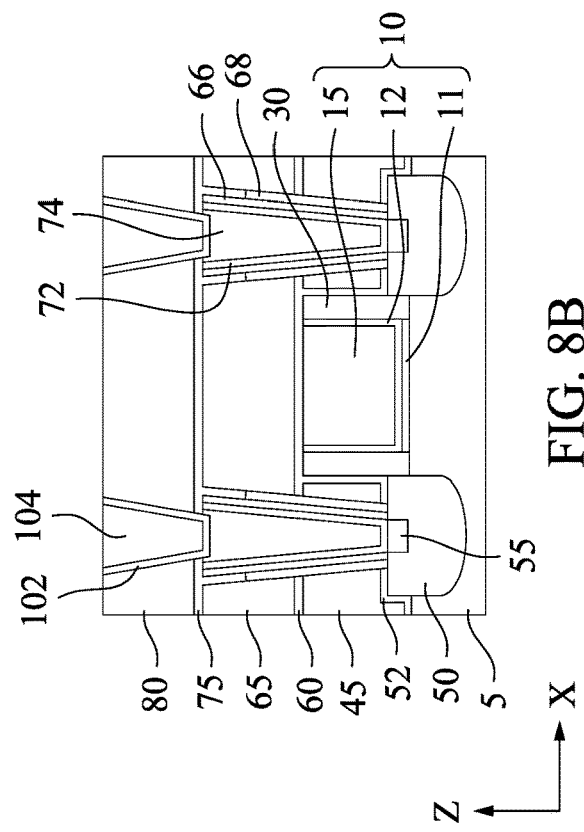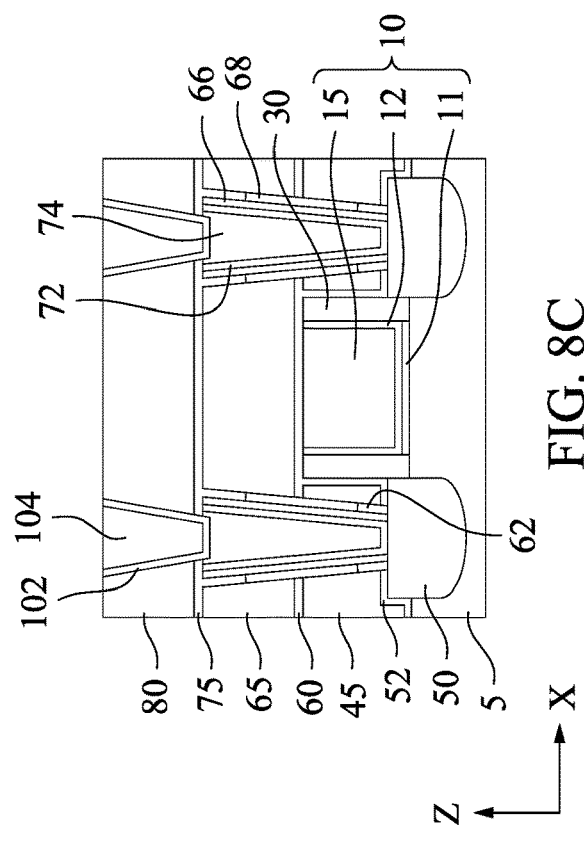

SEMICONDUCTOR DEVICE AND MANUFACTURING METHOD THEREOF

RELATED APPLICATIONS

This application is a divisional of U.S. patent application Ser. No. 17/197,995 filed Mar. 10, 2021, now U.S. Pat. No. 11,631,612, which claims priority to U.S. Provisional Patent Application No. 63/030,153 filed on May 26, 2020, the entire content of which is incorporated herein by reference.

BACKGROUND

As the semiconductor industry introduces new generations of integrated circuits (ICs) having higher performance and greater functionality, the density of the elements that form the ICs is increased, while the dimensions and spacing between components or elements of the ICs are reduced, which causes a variety of problems. For example, for any two adjacent conductive features, when the distance between the conductive features decreases, the resulting capacitance (parasitic capacitance) increases. The increased capacitance results in an increase of power consumption and an increase in the resistive-capacitive (RC) time constant, i.e., an increase of signal delays.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C and 3D show cross sectional views of various stages of the sequential fabrication process of a semiconductor device according to an embodiment of the present disclosure.

FIGS. 4A, 4B, 4C and 4D show cross sectional views of various stages of the sequential fabrication process of a semiconductor device according to an embodiment of the present disclosure.

FIGS. 7A, 7B, 7C and 7D show cross sectional views of various stages of the sequential fabrication process of a semiconductor device according to an embodiment of the present disclosure.

FIGS. 8A, 8B and 8C show cross sectional views of various stages of the sequential fabrication process of a semiconductor device according to an embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes and/or operations explained with respect to the one embodiment can be employed in other embodiments, and detailed explanation thereof may be omitted.

Figure 1A:
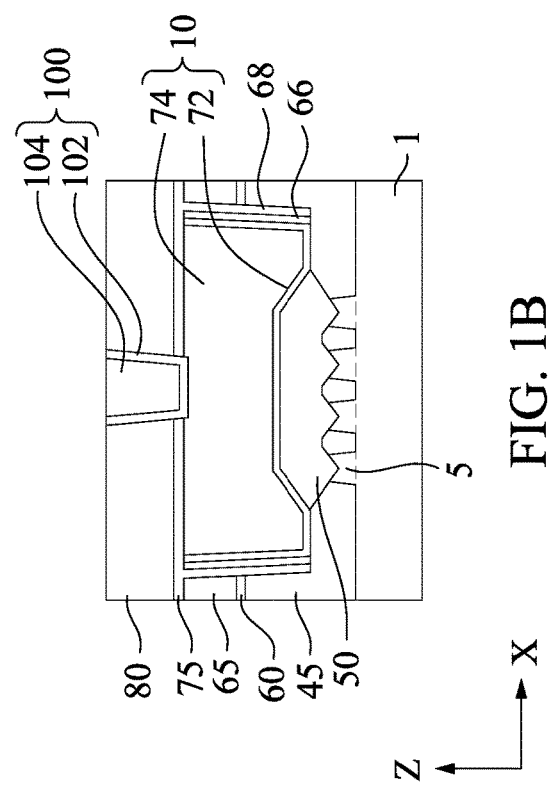
FIGS. 1A, 1B, 1C and 1D show various views of a semiconductor device according to an embodiment of the present disclosure.
Figure 1C:
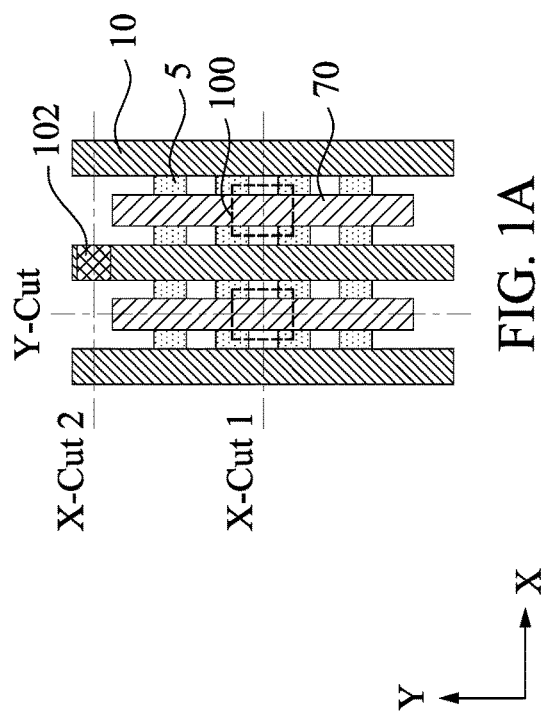
Figure 1B:
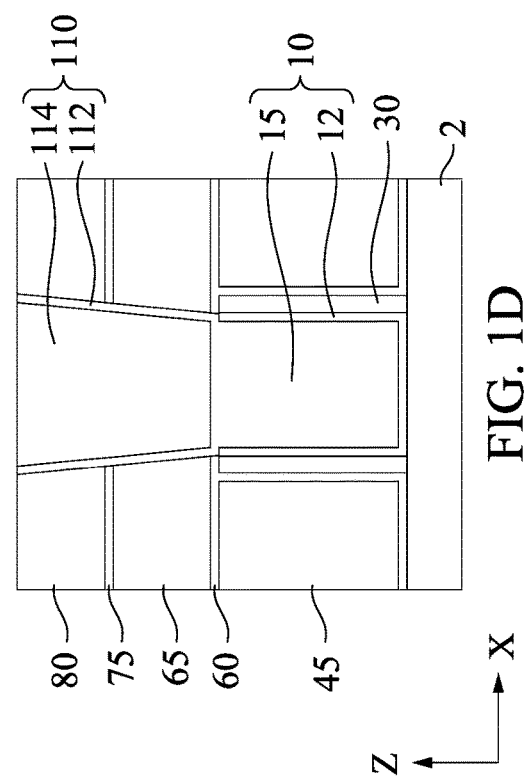
Figure 1D:
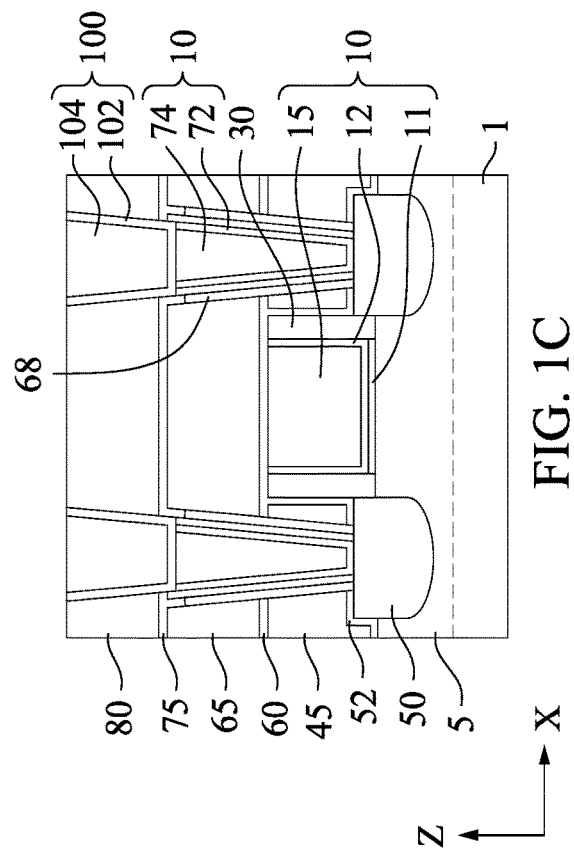

FIGS. 1A, 1B, 1C and 1D show various views of a semiconductor device according to an embodiment of the present disclosure. FIG. 1A is a plan view, FIG. 1B is a cross sectional view (Y-cut), FIG. 1C is a cross sectional view (X-cut 1) and FIG. 1D is a cross sectional view (X-cut 2). In some embodiments, the semiconductor device shown in FIGS. 1A-1D is a fin field effect transistor (Fin FET).

In FIG. 1A, three gate structures 10 extending in the Y direction are disposed over four fin structures 5 extending in the X direction disposed on a substrate 1. Portions between the gate structures 10 are source/drain regions 50 (see, FIGS. 1B and 1C), and source/drain contacts 70 are disposed over the source/drain regions 50. In some embodiments, the source/drain regions 50 include one or more epitaxially-formed semiconductor layers (epitaxial layers). In some embodiments, the source/drain contacts 70 are contact bars extending in the Y direction beyond the source/drain regions 50. Thus, a width of the source/drain epitaxial layer (source/drain region) 50 is smaller than a width (length) of the source/drain contact 70 in the Y direction. As shown in FIGS. 1A and 1B, a width of the source/drain contact 70 is greater than a width of the upper contact 100 in the Y direction, in some embodiments. In some embodiments, one or more gate contacts 110 are disposed on one or more gate electrodes of the gate structures 10. Further, in some embodiments, upper contacts 100 are disposed over the source/drain contacts 70.

As shown in FIGS. 1B-1D, the source/drain regions 50 are formed in a recess formed in the fin structure 5. The gate structure 10 includes an interfacial layer 11 made of a chemically formed silicon oxide, a gate dielectric layer 12 formed over the fin structure 5, and a metal gate electrode 15. The gate structure 10 is embedded in a first interlayer dielectric (ILD) layer 45. The first ILD layer 45 includes one or more dielectric layers. In some embodiments, a first etch stop layer 52 is formed on the gate structure 10 and the source/drain regions 50 as well as on the upper surface of an isolation insulating layer 2. Further, in some embodiments, a second etch stop layer 60 is disposed over the first ILD layer 45, and a second ILD layer 65 is formed over the second etch stop layer 60. Further, a third etch stop layer 75 is disposed over the second ILD layer 65 and a third ILD layer 80 is formed over the third etch stop layer 75 in some embodiments.

The first to third ILD layers 45, 65, 80 include one or more layers of insulating material, for example, a silicon oxide based material, such as silicon dioxide ($SiO_2$), SiOC and SiOCN. In some embodiments, a low-k material or an organic material is used for the ILD layers. The first, second and third etch stop layers 52, 60, 75 are made of different material than the ILD layers and include one or more layers of insulating material, for example, silicon nitride based material, such as silicon nitride and SiON.

In some embodiments, the third ILD layer 80 contains no Group IV elements other than Si and C. In other embodiments, the third ILD layer 80 includes Ge and/or Sn to introduce compressive stress in the third ILD layer 80. In some embodiments, a concentration of Ge and/or Sn is in a range from about 0.01 atomic % to 1 atomic %.

The source/drain contact 70 is formed in a contact opening (hole) passing through the first and second ILD layers 45, 65 and the first, second and third etch stop layers 52, 60, 75. In some embodiments, a first contact liner layer 72 is formed on the inner surface of the contact opening. In some embodiments, the contact opening is defined by an insulating layer 66. In some embodiments, the first contact liner layer 72 includes one or more conductive material layers, such as Ti, TiN, Ta and TaN. In certain embodiments, a TiN layer is used as the first contact liner layer 72. The source/drain contact 70 includes a first body layer 74 made of one or more conductive material layers, such as W, Co, Ni, Mo, Ru (purities are more than 99 atomic %) and an alloy thereof. In certain embodiments, the first body layer 74 is made of Co (more than 99 atomic %).

As shown in FIGS. 1B and 1C, an air gap 68 is disposed between the insulating layer 66 and the ILD layers and the etch stop layers in some embodiments of the present disclosure. The upper portion of the air gap 68 is capped by a part of the third etch stop layer 75 in some embodiments. In some embodiments, the insulating layer 66 is not formed, and the air gap 68 is disposed between the ILD layers and the source/drain contact 70.

The upper contact 100 is formed in a contact opening (hole) passing through the third ILD layer 80 and the third etch stop layer 75. The upper contact 100 includes a second liner layer 102 and a second body layer 104. In some embodiments, the second contact liner layer 102 includes one or more conductive material layers, such as Ti, TiN, Ta and TaN. In certain embodiments, a TiN layer is used as the second contact liner layer 102. In some embodiments, the second body layer 104 made of one or more conductive material layers, such as W, Co, Ni, Mo, Ru (purities are more than 99 atomic %) and an alloy thereof. In certain embodiments, the second body layer 104 is made of Co (more than 99 atomic %), or Ru (more than 99 atomic %). As shown in FIG. 1D, an upper contact 110 (a gate contact) is also formed in a contact opening (hole) passing through the third ILD layer 80, the third etch stop layer 75, the second ILD layer 65, the second etch stop layer 60 and the first etch stop layer 52. The upper contact 110 includes a liner layer 112 and a body layer 114 the same as or similar to the second liner layer 102 and the second body layer 104, respectively.

In some embodiments, a part of the upper contact 100 penetrates into the source/drain contact 70. Further, in some embodiments, the part of the upper contact 100 is disposed below the third etch stop layer 75 and is in contact with a bottom surface of the third etch stop layer 75, forming a rivet shape. In some embodiments, the part of the upper contact 100 penetrating into the source/drain contact 70 is in contact with the first contact liner layer 72. The upper contact 100 has a rivet shape with a convex round head in some embodiments. In other embodiments, the head of the rivet shape is a triangular or a trapezoid with or without rounded corners.

In some embodiments, a bottom corner of the third etch stop layer 75 has a rounded corner. In some embodiments, an upper corner of the third etch stop layer 75 has a rounded corner of which a radius of curvature (more than 0 nm) is smaller than a radius of curvature of the bottom corner. In other embodiments, the upper corner of the third etch stop layer 75 is not rounded.

In FIG. 1B, the source/drain epitaxial layer 50 is formed on four fin structures as a merged source/drain epitaxial layer. However, the number of fin structures is not limited to four. In some embodiments, the source/drain epitaxial layer 50 is formed on only one fin structure without merging with another source/drain epitaxial layer. In some embodiments, the width of the source/drain contact in Y direction (gate extending direction) is smaller than a width of the source/drain epitaxial layer 50.

In some embodiments, at least one of the first, second and third etch stop layers are not formed. In some embodiments, the air gap is not capped by an etch stop layer (e.g., 75) but is capped by an ILD layer (e.g., 80) formed above the air gap. In other words, the etch stop layer 75 can be omitted. In some embodiments, one or more ILD layers and one or more etch stop layers are collectively referred to as an ILD layer.

FIGS. 2A-2E show various stages of a sequential fabrication process of a semiconductor device corresponding to the structure shown in FIGS. 1A-1D according to an embodiment of the present disclosure. It is understood that additional operations can be provided before, during, and after processes shown by FIGS. 2A-2E, and some of the operations described below can be replaced or eliminated, for additional embodiments of the method. The order of the operations/processes may be interchangeable.

Figure 2A:
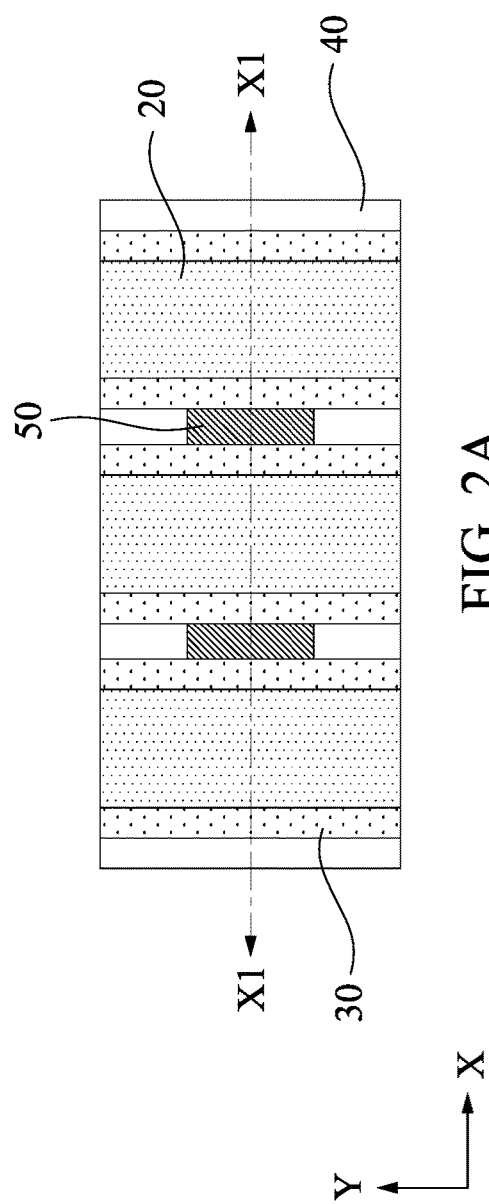
FIG. 2A shows a plan view (viewed from the above) illustrating one of the various stages of a sequential fabrication process of a semiconductor device according to one embodiment of the present disclosure.
Figure 2B:
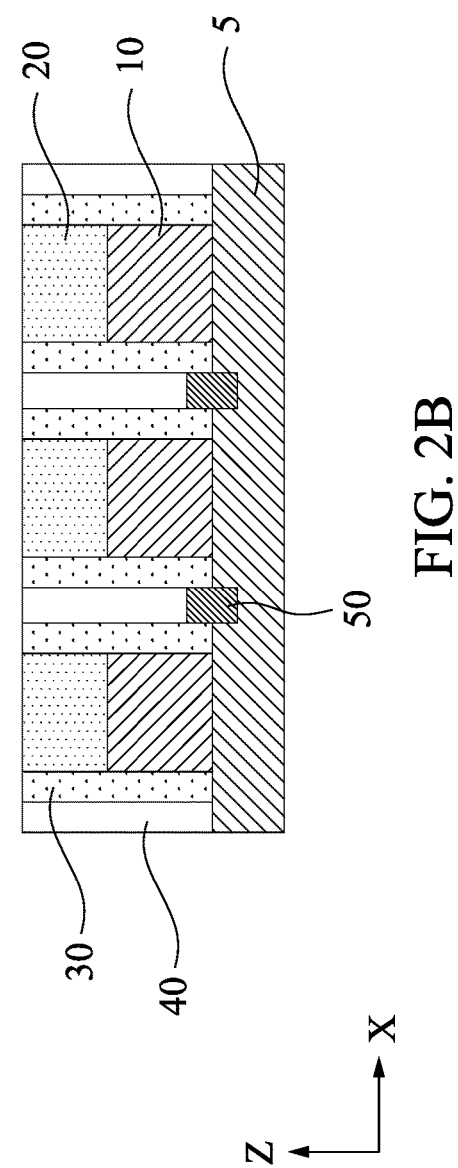
FIG. 2B shows a cross sectional view along line X1-X1 of FIG. 2A.

FIGS. 2A and 2B show one of the stages of a sequential fabrication process of a semiconductor device according to one embodiment of the present disclosure. FIG. 2A shows a plan (top) view and FIG. 2B shows a cross sectional view along line X1-X1 of FIG. 2A.

FIGS. 2A and 2B show a structure of a semiconductor device after metal gate structures 10 are formed. The metal gate structure 10 includes a metal gate electrode 15 and a gate dielectric layer 12. In FIGS. 2A and 2B, metal gate structures 10 are formed over a channel region of the fin structure 5, for example, a part of a fin structure, and cap insulating layers 20 are disposed over the metal gate structures 10. The thickness of the metal gate structures 10 is in a range from 15 nm to 50 nm in some embodiments. The thickness of the cap insulating layer 20 is in a range from about 10 nm to about 30 nm in some embodiments, and is in a range from about 15 nm to about 20 nm in other embodiments. Sidewall spacers 30 are provided on sidewalls of metal gate structure 10 and the cap insulating layer 20. The film thickness of the sidewall spacers 30 at the bottom of the sidewall spacers is in a range from about 3 nm to about 15 nm in some embodiments, and is in a range from about 4 nm to about 8 nm in other embodiments. The combination of the metal gate structure 10, the cap insulating layer 20 and sidewall spacers 30 may be collectively referred to as a gate structure. Further, source/drain regions 50 are formed adjacent to the gate structures, and spaces between the gate structures are filled with an interlayer dielectric (ILD) layer 40.

Figure 2C:
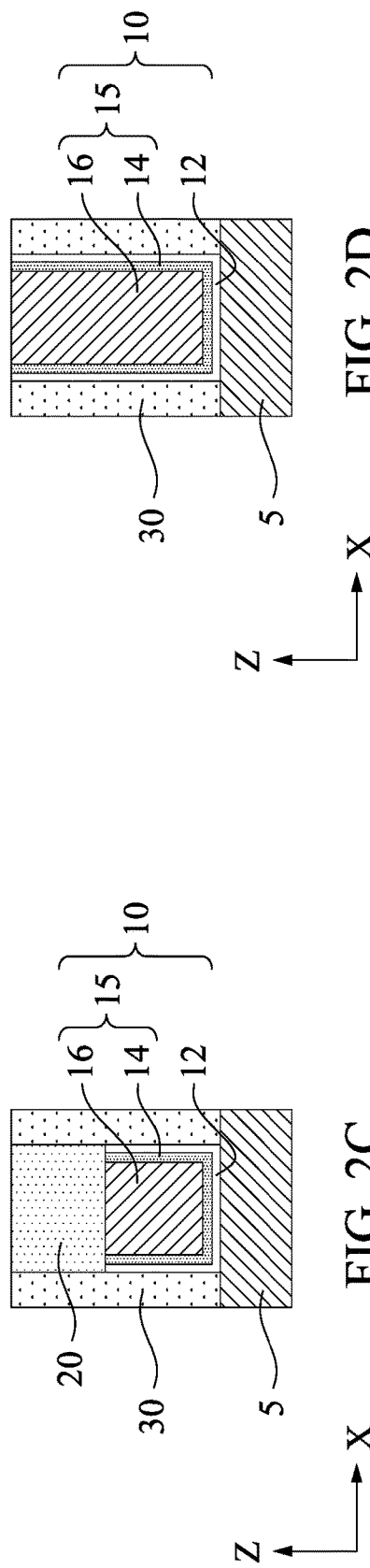
FIGS. 2C and 2D are enlarged views of the gate structure.

FIG. 2C is an enlarged view of the gate structure. The metal gate electrode 15 includes one or more layers 16 of metal material, such as Al, Cu, W, Ti, Ta, TiN, TiAl, TiAlC, TiAlN, TaN, NiSi, CoSi, or other conductive materials. A gate dielectric layer 12 disposed between the channel region of the fin structure 5 and the metal gate electrode includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof.

In some embodiments, one or more work function adjustment layers 14 are interposed between the gate dielectric layer 12 and the metal material 16. The work function adjustment layers 14 are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer.

The cap insulating layer 20 includes one or more layers of insulating material such as silicon nitride based material including SiN, SiCN and SiOCN. The gate sidewall spacer 30 is made of a different material than the cap insulating layer 20 and includes one or more layers of insulating material such as a silicon nitride based material, including SiN, SiON, SiCN and SiOCN. The ILD layer 40 includes one or more layers of an insulating material, such as, a silicon oxide based material including silicon dioxide ($SiO_2$) and SiON.

Figure 2D:

In some embodiments, no gate cap insulating layer is formed, as shown in FIG. 2D.

The material of the sidewall spacer 30, the material of the cap insulating layer 20, and a material of the ILD layer 40 are different from each other, so that each of these layers can be selectively etched. In one embodiment, the gate sidewall spacer 30 is made of SiOCN, SiCN or SiON, the cap insulating layer 20 is made of SiN, and the ILD 40 layer is made of $SiO_2$.

In this embodiment, fin field effect transistors (Fin FETs) fabricated by a gate-replacement process are employed.

Figure 2E:
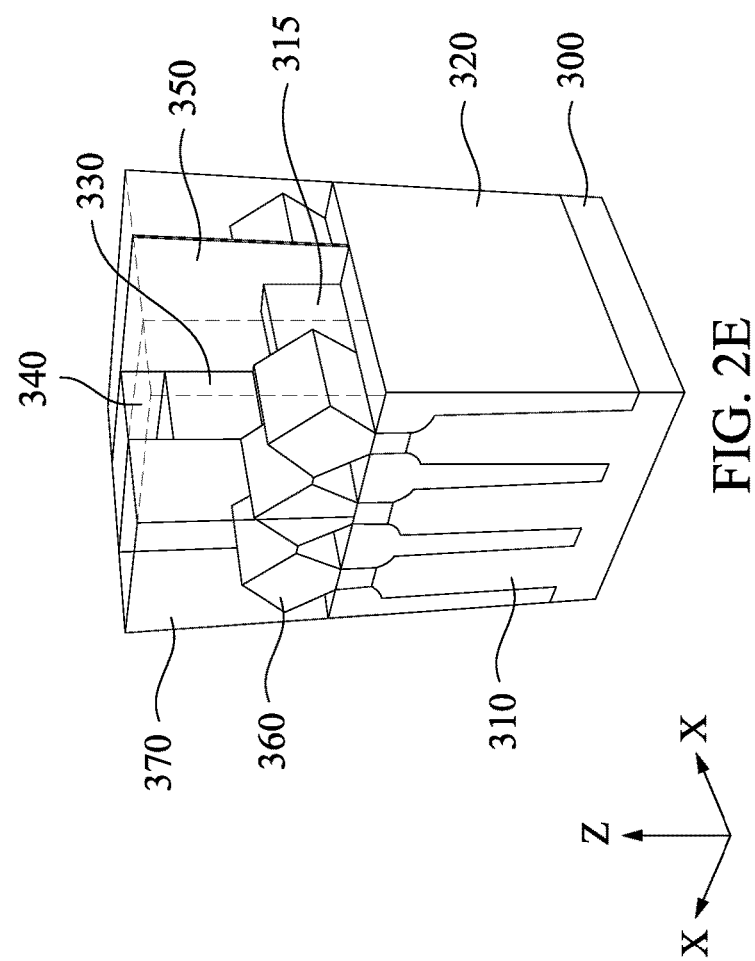
FIG. 2E shows a perspective view illustrating one of the various stages of a sequential fabrication process of a semiconductor device according to one embodiment of the present disclosure.

FIG. 2E shows an exemplary perspective view of a Fin FET structure.

First, a fin structure 310 is fabricated over a substrate 300. The fin structure includes a bottom region and an upper region as a channel region 315. The substrate is, for example, a p-type silicon substrate with an impurity concentration in a range from about $1\times10^{15}$ $cm^{-3}$ to about $1\times10^{18}$ $cm^{-3}$. In other embodiments, the substrate is an n-type silicon substrate with an impurity concentration in a range from about $1\times10^{15}$ $cm^{-3}$ to about $1\times10^{18}$ $cm^{-3}$. Alternatively, the substrate may comprise another elementary semiconductor, such as germanium; a compound semiconductor including Group IV-IV compound semiconductors, such as SiC and SiGe; Group III-V compound semiconductors, such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

After forming the fin structure 310, an isolation insulating layer 320 is formed over the fin structure 310. The isolation insulating layer 320 includes one or more layers of insulating materials such as silicon oxide, silicon oxynitride or silicon nitride, formed by LPCVD (low pressure chemical vapor deposition), plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating layer 320 over the fin structure, a planarization operation is performed to remove part of the isolation insulating layer 320. The planarization operation may include a chemical mechanical polishing (CMP) and/or an etch-back process. Then, the isolation insulating layer 320 is further removed (recessed) so that the upper region of the fin structure is exposed.

A dummy gate structure is formed over the exposed fin structure. The dummy gate structure includes a dummy gate electrode layer made of poly silicon and a dummy gate dielectric layer. Gate sidewall spacers 350 including one or more layers of insulating materials are also formed on sidewalls of the dummy gate electrode layer. After the dummy gate structure is formed, the fin structure 310 not covered by the dummy gate structure is recessed below the upper surface of the isolation insulating layer 320. Then, a source/drain region 360 is formed over the recessed fin structure by using an epitaxial growth method. The source/drain region may include a strain material to apply stress to the channel region 315.

Then, an interlayer dielectric (ILD) layer 370 is formed over the dummy gate structure and the source/drain region. After a planarization operation, the dummy gate structure is removed to make a gate space. Then, in the gate space, a metal gate structure 330 including a metal gate electrode and a gate dielectric layer, such as a high-k dielectric layer, is formed. Further, the cap insulating layer 340 is formed over the metal gate structure 330, to obtain the Fin FET structure shown in FIG. 2E. In FIG. 2E, parts of the metal gate structure 330, the cap insulating layer 340, the gate sidewall spacers 350 and the ILD layer 370 are cut to show the underlying structure.

The fin structure 310, the metal gate structure 330, the cap insulating layer 340, the gate sidewall spacers 350, the source/drain region 360 and the ILD layer 370 of FIG. 2E substantially correspond to the fin structure 5, the metal gate structures 10, the cap insulating layers 20, the gate sidewall spacers 30, the source/drain regions 50 and the interlayer dielectric (ILD) layer 40, of FIGS. 1A-1D, respectively. In some embodiments, one or more ILD layer is additionally formed over the ILD layer 40, thereby forming a first ILD layer 45.

FIGS. 3A to 5D show various stages of a sequential fabrication process of a semiconductor device corresponding to the structure shown in FIGS. 1A-1D according to an embodiment of the present disclosure. It is understood that additional operations can be provided before, during, and after processes shown by FIGS. 3A-5D, and some of the operations described below can be replaced or eliminated, for additional embodiments of the method. The order of the operations/processes may be interchangeable. Materials, configurations, dimensions, processes and/or operations explained with respect to the foregoing embodiments can be employed in the following embodiments, and detailed explanation thereof may be omitted.

After the metal gate structure 10 is formed, a first insulating layer as the second etch stop layer 60 is formed over the first ILD layer 45 (or 40), and a second insulating layer as the second ILD layer 65 is formed over the second etch stop layer 60, as shown in FIG. 3A. The second etch stop layer 60 and the second ILD layer 65 are formed by suitable film formation methods, such as CVD, physical vapor deposition (PVD) or atomic layer deposition (ALD).

By using one or more lithography and etching operations, a first contact opening 61 for a lower contact (source/drain contact) 70 is formed in the first and second ILD layers 45, 65, as shown in FIG. 3B.

Then, a sacrificial layer 62 is conformally formed in the first contact opening 61, as shown in FIG. 3C. In some embodiments, the sacrificial layer 62 includes amorphous or polycrystalline semiconductor material, such as Si, SiGe or Ge, which is doped or undoped. In other embodiments, the sacrificial layer 62 includes one or more dielectric material, or one or more conductive material. When the sacrificial layer 62 is made of a dielectric material, the dielectric material is different from the first and second ILD layer and the first and second etch stop layers.

The sacrificial layer 62 is formed by suitable film formation methods, such as CVD, or ALD. In some embodiments, the thickness of the sacrificial layer 62 is in a range from about 1 nm to about 10 nm and is in a range from about 2 nm to about 5 nm in other embodiments, depending of the design and/or process requirements. Then, as shown in FIG. 3D, anisotropic etching is performed to remove horizontal part of the sacrificial layer 62 to expose the upper surface of the source/drain epitaxial layer 50.

Next, as shown in FIG. 4A, a third insulating layer 66 is formed on the sacrificial layer 62 in the first contact opening 61. In some embodiments, the third insulating layer 66 includes one or more layers of silicon oxide, silicon nitride, SiON, SiOC, SiOCN, SiCN or other suitable material different from the sacrificial layer 62. The third insulating layer 66 is formed by suitable film formation methods, such as CVD, or ALD. In some embodiments, the thickness of the third insulating layer 66 is in a range from about 1 nm to about 10 nm and is in a range from about 2 nm to about 5 nm in other embodiments, depending on the design and/or process requirements. Then, as shown in FIG. 4B, anisotropic etching is performed to remove the horizontal part of the insulating layer 66 to expose the upper surface of the source/drain epitaxial layer 50.

In some embodiments, the anisotropic etching of FIG. 3D is not performed. In such a case, after or during the anisotropic etching of the third insulating layer 66, a bottom part of the sacrificial layer 62 is etched to expose the upper surface of the source/drain epitaxial layer 50. In some embodiments, a small part of the sacrificial layer 62 remains between the third insulating layer 66 and the source/drain epitaxial layer.

Subsequently, a first contact liner layer 72 is conformally formed on the insulating layer and the source/drain epitaxial layer 50 in the first contact opening 61 and on the upper surface of the second ILD layer 65, and a conductive material for the first body layer 74 is formed over the first contact liner layer 72. The first contact liner layer 72 and the conductive material layer are formed by suitable film formation methods, such as CVD, PVD, ALD or plating. Subsequently, a planarization operation, such as an etch back operation or a chemical mechanical polishing (CMP) operation, is performed to form the source/drain contact 70, as shown in FIG. 4C.

Then, the sacrificial layer 62 is at least partially or fully removed to form air gap space 68 by using one or more wet and/or dry etching operations, as shown in FIG. 4D. In some embodiments, when the sacrificial layer 62 is made of polysilicon or amorphous silicon, the sacrificial layer 62 can be removed by a wet etching using a tetramethylammonium hydroxide aqueous solution. In some embodiments, a residual piece of the sacrificial layer 62 remains at the bottom of the air gap 68, as shown in FIG. 8C. The amount of the residual piece is about 1-5% of the total height of the air gap space from the bottom of the air gap space in some embodiments.

Figure 5A:
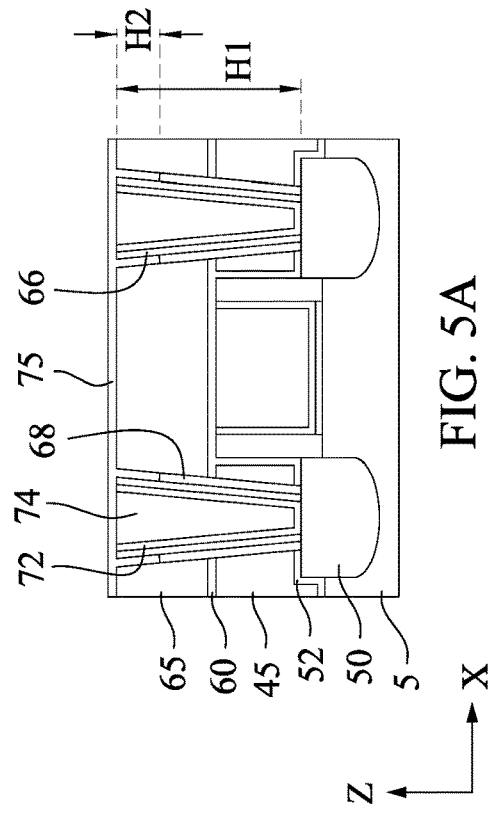
FIGS. 5A, 5B, 5C and 5D show cross sectional views of various stages of the sequential fabrication process of a semiconductor device according to an embodiment of the present disclosure.

Further, as shown in FIG. 5A, a fourth insulating layer as a third etch stop layer 75 is formed over the source/drain contact 70, the opening of the air gaps space and the second ILD layer. The upper portion of the air gap space 68 is filled by the third etch stop layer 75 to form an air gap 68. In some embodiments, about 5-20% of the total height H1 of the air gap space from the top of the opening of the air gap space is filled by the third etch stop layer (penetrating amount H2 is about 5-20% of H1). In some embodiments, the height H1 is equal to a height of the source/drain contact 70. In some embodiments, the thickness of the third etch stop layer 75 is in a range from about 5 nm to about 20 nm and is in a range from about 10 nm to about 15 nm in other embodiments.

Figure 5B:
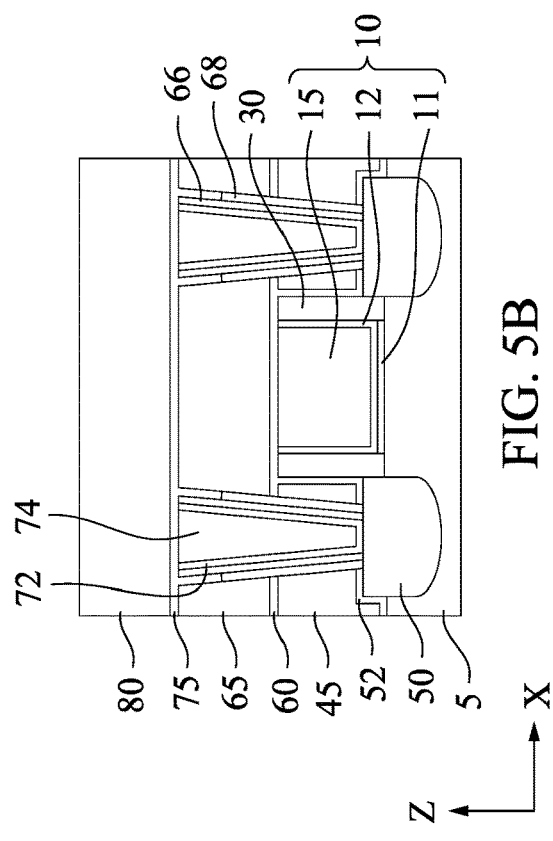
Figure 5C:
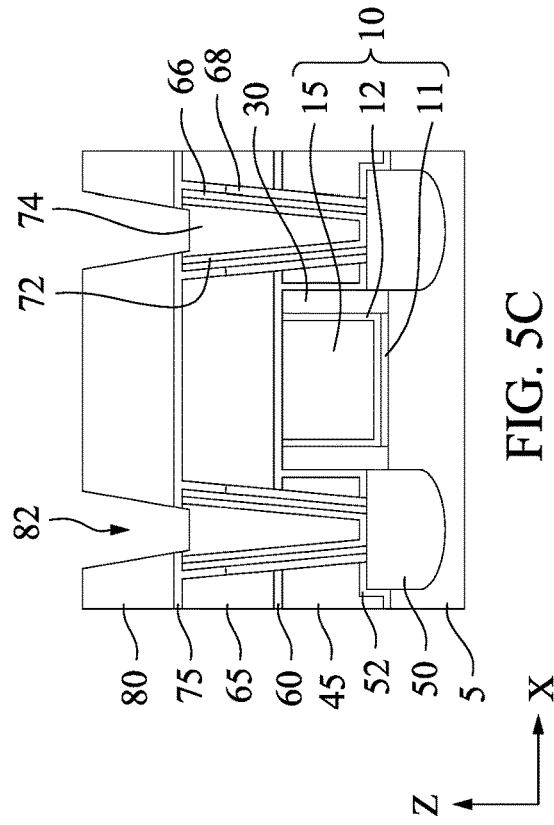

Subsequently, a fifth insulating layer as the third ILD layer 80 are formed, as shown in FIG. 5B. As shown in FIG. 5C, by using one or more lithography and etching operations, a second contact opening 82 for the upper contact 100 is formed in the third ILD layer 80 and the third etch stop layer 75, and a third contact opening for the gate contact 110 is formed in the third ILD layer 80, the third etch stop layer 75 and the second ILD layer 65. In some embodiments, the contact opening 82 and the contact opening for the gate contact are formed at the same etching operation using the same photo mask, and in other embodiments, the contact opening 82 and the contact opening for the gate contact are formed by different etching operations using different photo masks.

In some embodiments, the exposed portion of the source/drain contact 70 is partially etched (recessed) to form a recess. In some embodiments, the exposed upper portion of the source/drain contacts 70 is vertically and laterally (horizontally) etched to form the recess. The etching is one or more of isotropic etching operations in some embodiments. In some embodiments, the etching is wet etching using an acid. In some embodiments, the acid is an organic acid. In certain embodiments, when the source/drain contact layer 70 is made of Co, the organic acid is a 4-methyl-2-(phenylamino)-1,3-thiazole-5-carboxylic acid. In some embodiments, after the acid etching, a wet cleaning operation using isopropyl alcohol is performed. In other embodiments, the etching is a chemical dry etching using a gas containing, for example, HCl. In some embodiments, the wet etchant includes benzotriazole.

Next, a pre-deposition cleaning operation is performed at the second contact hole 82 and the recessed source/drain contact 70. In some embodiments, the pre-deposition cleaning operation includes a plasma treatment. In some embodiments, the plasma treatment includes hydrogen plasma and/or argon plasma. In certain embodiments, the plasma treatment includes a hydrogen plasma treatment followed by an argon plasma treatment. In some embodiments, a time duration of the hydrogen plasma treatment is longer than a time duration of the argon plasma treatment. In some embodiments, the time duration of the hydrogen plasma treatment is in a range from about 60 sec to about 300 sec, and is in a range from about 90 sec to about 250 sec in other embodiments, depending on design and/or process requirements/conditions. In some embodiments, the time duration of the argon plasma treatment is in a range from about 1 sec to about 10 sec, and is in a range from about 2 sec to about 8 sec in other embodiments, depending on design and/or process requirements/conditions.

Figure 5D:
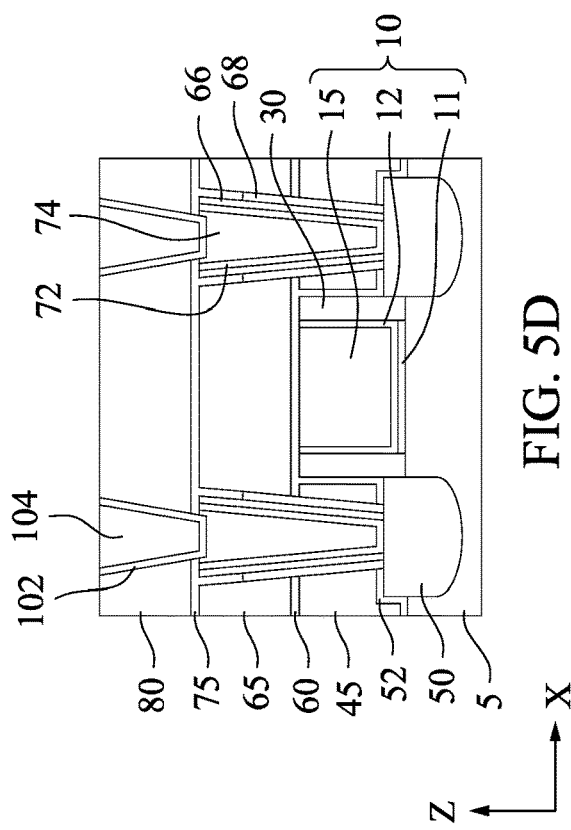

Subsequent to the pre-deposition cleaning operation, a second liner layer 102 and a conductive material layer for the second body layer 104 are formed in the second contact hole 82 and on the third ILD layer 80, and then, as shown in FIG. 5D, a planarization operation, such as an etch-back operation or a CMP operation, is performed to form the upper contact 100. In some embodiments, the second liner layer 102 is not formed and the second body layer 104 is in direct contact with the source/drain contact 70 and the third ILD layer 80.

It is understood that the device shown in FIG. 5D undergoes further CMOS processes to form various features such as interconnect metal layers, dielectric layers, passivation layers, etc.

FIGS. 6A-6D and 7A-7D show various stages of a sequential fabrication process of a semiconductor device according to an embodiment of the present disclosure. It is understood that additional operations can be provided before, during, and after processes shown by FIGS. 6A-7D, and some of the operations described below can be replaced or eliminated, for additional embodiments of the method. The order of the operations/processes may be interchangeable. Materials, configurations, dimensions, processes and/or operations explained with respect to the foregoing embodiments can be employed in the following embodiments, and detailed explanation thereof may be omitted.

Figures 6A, 6B, 6C, 6D:
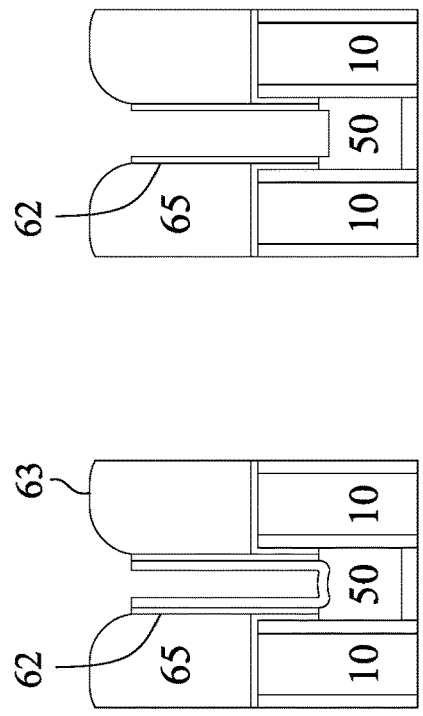
FIGS. 6A, 6B, 6C and 6D show cross sectional views of various stages of the sequential fabrication process of a semiconductor device according to an embodiment of the present disclosure.

FIG. 6A shows a cross sectional view after the sacrificial layer 62 is formed similar to FIG. 3C. In some embodiments, depending on the etching conditions for forming the first opening 61, the upper surface of the ILD layer 65 has a curved shape.

Then, similar to the operation explained with respect to FIG. 3D, anisotropic etching is performed to remove the lateral portion of the sacrificial layer 62. Further, in some embodiments, an oxide layer 63 is formed on the sacrificial layer 62 and the exposed surface of the source/drain epitaxial layer 50 in the first opening 61 as shown in FIG. 6B, to protect the exposed source/drain epitaxial layer 50 from a subsequent plasma treatment. In some embodiments, the oxide layer is a silicon oxide layer formed by CVD or ALD and has a thickness in a range from about 0.5 nm to about 2 nm.

Further, in some embodiments, a plasma treatment for a cleaning purpose is performed to clean the surface of the structure as shown in FIG. 6C. In some embodiments, the plasma is generated from a gas containing oxygen, or a gas containing $N_2$ and $H_2$, where an amount of $H_2$ is about 1-10%. In some embodiments, the oxide layer 63 is partially removed during the plasma treatment. In some embodiments, the plasma is oxygen plasma. After the plasma treatment, a wet cleaning process is performed to fully remove the oxide layer, as shown in FIG. 6D. The solution for the wet cleaning process includes one or more of $H_2SO_4$, HCl or $H_2O_2$, with water.

After the wet cleaning, similar to the operation explained with respect to FIG. 4A a third insulating layer 66 is formed as shown in FIG. 7A. Next, similar to the operation explained with respect to FIG. 4B, anisotropic etching is performed to remove the lateral portion of the third insulating layer 66 as shown in FIG. 7B. In some embodiments, the plasma treatment and wet cleaning operations as explained with respect to FIGS. 6C and 6D are performed after the anisotropic etching of the third insulating layer 66 with or without a silicon oxide layer.

Further, the operations similar to the operations explained with respect to FIGS. 4C and 4D are performed to form an air gap space 68 as shown in FIG. 7C. Then, similar to the operation explained with respect to FIG. 5A, the third etch stop layer 75 is formed to form the air gap 68 as shown in FIG. 7D. It is understood that the device shown in FIG. 7D undergoes further process as explained with respect to FIGS. 5B-5D to form the upper contact.

FIGS. 8A and 8B show various stages of a sequential fabrication process of a semiconductor device according to an embodiment of the present disclosure. It is understood that additional operations can be provided before, during, and after processes shown by FIGS. 8A and 8B, and some of the operations described below can be replaced or eliminated, for additional embodiments of the method. The order of the operations/processes may be interchangeable. Materials, configurations, dimensions, processes and/or operations explained with respect to the foregoing embodiments can be employed in the following embodiments, and detailed explanation thereof may be omitted.

In some embodiments, as shown in FIG. 8A, after the anisotropic etching of the third insulating layer 66 as shown in FIG. 4B and before forming the first contact liner layer 72 of the source/drain contact 70, a silicide layer 55 is formed at the surface of the source/drain epitaxial layer 50. The metal element of the silicide layer 55 includes one or more of Ti, Ta, Ni, Co, W, Mo, Ru, Pt or any other suitable element. In some embodiments, the silicide layer 55 further includes Ge, C, Sn, B, P, As or In. As shown in FIG. 8B, the first contact liner layer 72 is in contact with the silicide layer 55. In some embodiments, the silicide layer 55 does not extend below the third insulating layer 66. In other embodiments, the silicide layer 55 extends below the third insulating layer 66 but does not extend below the air gap 68.

FIGS. 9A-9D show various stages of a sequential fabrication process of a semiconductor device according to an embodiment of the present disclosure. It is understood that additional operations can be provided before, during, and after processes shown by FIGS. 9A-9D, and some of the operations described below can be replaced or eliminated, for additional embodiments of the method. The order of the operations/processes may be interchangeable. Materials, configurations, dimensions, processes and/or operations explained with respect to the foregoing embodiments can be employed in the following embodiments, and detailed explanation thereof may be omitted.

Figure 9A:
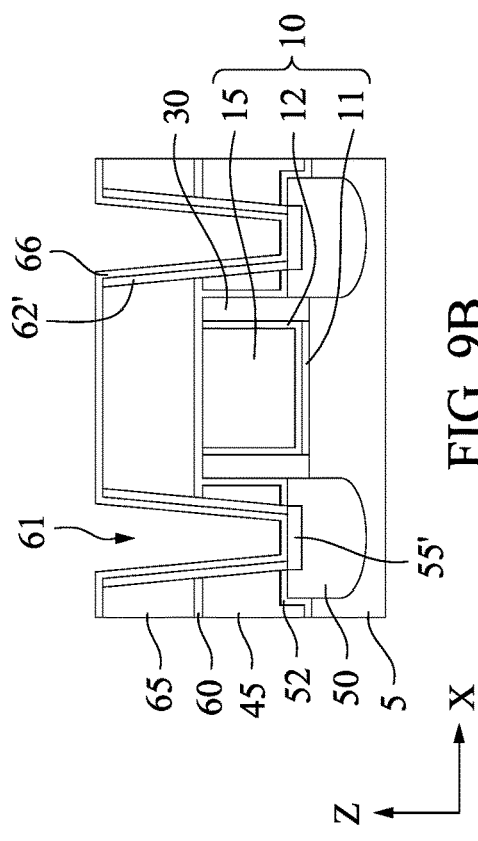
FIGS. 9A, 9B, 9C and 9D show cross sectional views of various stages of the sequential fabrication process of a semiconductor device according to an embodiment of the present disclosure.

FIG. 9A shows the structure after the third insulating layer 66 is formed. In some embodiments, the sacrificial layer 62' includes one or more of Ti, Ta, Ni, Co, W, Mo, Ru, Pt or any other element which forms silicide. In some embodiments, the anisotropic etching of the sacrificial layer 62' is not performed, the sacrificial layer covers the upper surface of the source/drain epitaxial layer 50. Then, the third insulating layer 66 is formed on the sacrificial layer 62'.

Figure 9B:
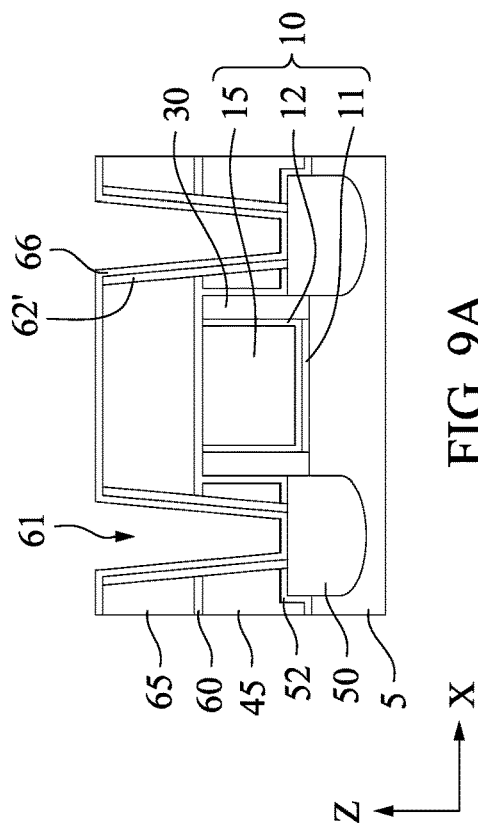
Figure 9C:
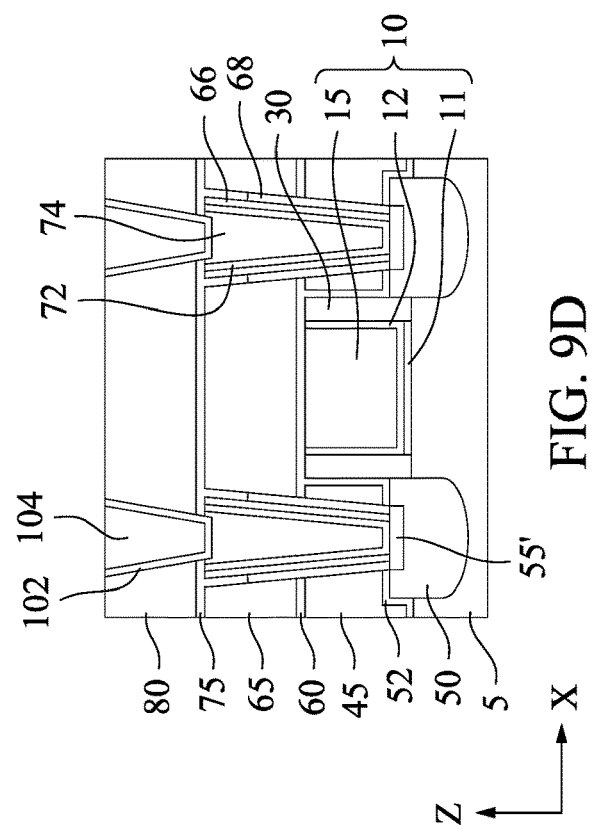
Figure 9D:
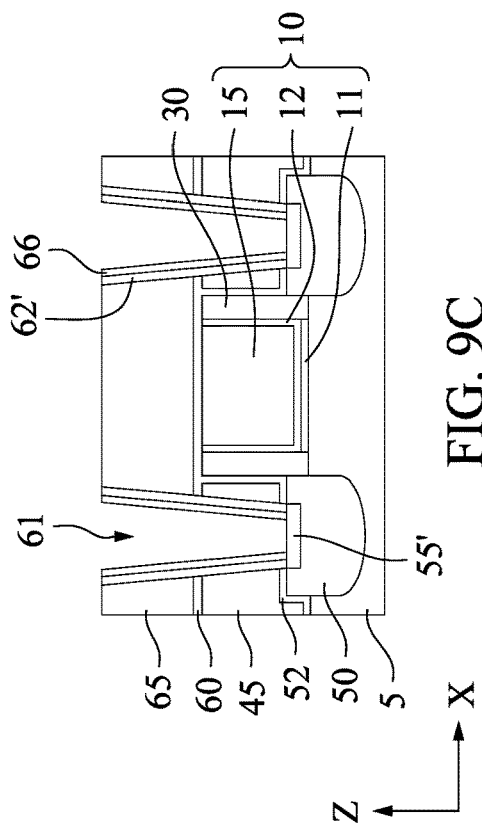

Next, a thermal operation is performed to form a silicide layer 55' by a reaction between the sacrificial layer 62' and the source/drain epitaxial layer 50, as shown in FIG. 9B. In some embodiments, the silicide layer 55' further includes Ge, C, Sn, B, P, As or In. Then, an isotropic etching is performed to remove the lateral portion of the third insulating layer 66, thereby exposing the silicide layer 55' at the bottom of the first contact opening 61 as shown in FIG. 9C. As shown in FIG. 9D, the first contact liner layer 72 is in contact with the silicide layer 55'. In some embodiments, the silicide layer 55' extends below the third insulating layer 66 and the air gap 68.

Figure 10A:
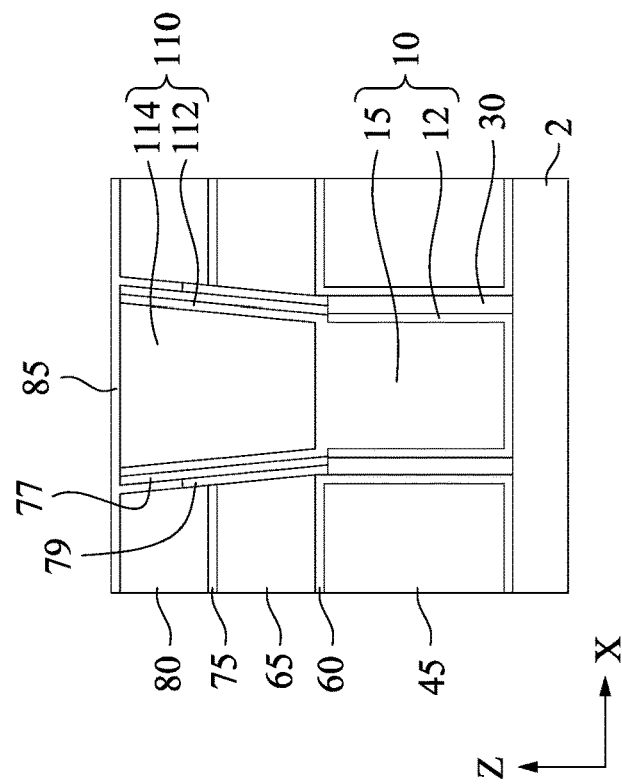
FIGS. 10A and 10B show cross sectional views of a semiconductor device according to an embodiment of the present disclosure.
Figure 10B:
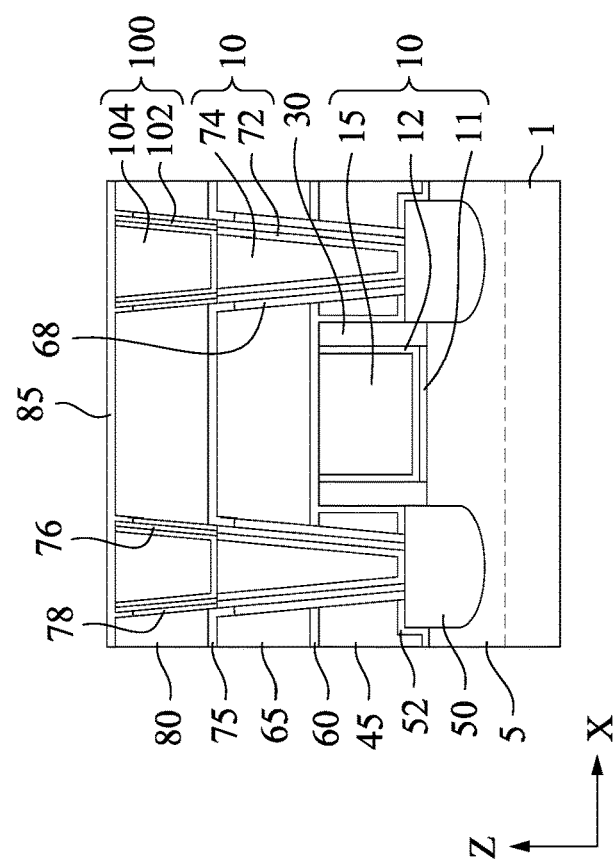

FIGS. 10A and 10B show cross sectional views of a semiconductor device according to an embodiment of the present disclosure. Materials, configurations, dimensions, processes and/or operations explained with respect to the foregoing embodiments can be employed in the following embodiments, and detailed explanation thereof may be omitted.

In some embodiments, the air gap formed by the manufacturing operations as set forth above can be applied to other contacts, for example, an upper contact 100 and a gate contact 110. As shown in FIG. 10A, an air gap 78 is formed on sides of the upper contact 100 between the third ILD layer 80 and an insulating liner layer 76 made of, for example, silicon nitride, SiON or SiOCN, and capped by a fourth etch stop layer. Further, as shown in FIG. 10B, an air gap 79 is formed on sides of the upper contact 110 between the third ILD layer 80 and an insulating liner layer 77 made of, for example, silicon nitride, SiON or SiOCN, and capped by the fourth etch stop layer. The insulating liner layers 76 and 77 may not be formed in some embodiments.

In the present embodiments, since an air gap is formed on sides of the source/drain contact, it is possible to reduce parasitic capacitance and improve device performance.

The various embodiments or examples described herein offer several advantages over the existing art. It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a source/drain structure is formed over a substrate, a first interlayer dielectric (ILD) layer including one or more dielectric layers is formed over the source/drain structure, a first opening is formed in the first ILD layer to at least partially expose the source/drain structure, a sacrificial layer is formed on an inner wall of the first opening, a first insulating layer is formed on the sacrificial layer, a conductive layer is formed on the first insulating layer so as to form a source/drain contact in contact with the source/drain structure, the sacrificial layer is removed to form a space between the first insulating layer and the first ILD layer, and a second insulating layer is formed over the source/drain contact and the first ILD layer to cap an upper opening of the space, thereby forming an air gap. In one or more of the foregoing and the following embodiments, the sacrificial layer includes one of amorphous or polycrystalline Si, SiGe or Ge. In one or more of the foregoing and the following embodiments, a metal gate structure is further formed, and the air gap is disposed between the source/drain contact and the metal gate structure. In one or more of the foregoing and the following embodiments, the metal gate structure includes a metal gate electrode and gate sidewall spacers disposed on opposing side faces of the metal gate electrode, and a part of the first ILD layer is disposed between the air gap and one of the gate sidewall spacers. In one or more of the foregoing and the following embodiments, the second insulating layer is formed such that a part of the second insulating layer penetrates into the space. In one or more of the foregoing and the following embodiments, a penetrating amount of the second insulating layer into the space is 5-20% of a total height of the space. In one or more of the foregoing and the following embodiments, after the sacrificial layer is formed and before the first insulating layer is formed, an oxide layer is formed on the sacrificial layer and a part of an upper surface of the source/drain structure, a plasma treatment is performed on the oxide layer, and a wet cleaning operation is performed. In one or more of the foregoing and the following embodiments, the plasma treatment comprises oxygen plasma. In one or more of the foregoing and the following embodiments, a second ILD layer is further formed on the second insulating layer, a second opening is formed in the second ILD layer and the second insulating layer to at least partially expose the source/drain contact, and the second opening is filled with a second conductive material to form an upper contact in contact with the source/drain contact.

In accordance with another aspect of the present disclosure, in a method of manufacturing a semiconductor device, a source/drain epitaxial layer is formed over a substrate, a first interlayer dielectric (ILD) layer is formed over the source/drain epitaxial layer, a first insulating layer made of a different material than the first ILD layer is formed over the first ILD layer, a second ILD layer made of a different material than the first insulating layer is formed over the first insulating layer, a first opening passing through the second ILD layer, the first insulating layer and the first ILD layer is formed to at least partially expose the source/drain epitaxial layer, a sacrificial layer is formed on an inner wall of the first opening, a second insulating layer is formed on the sacrificial layer, a conductive layer is formed on the second insulating layer so as to form a source/drain contact in contact with the source/drain epitaxial layer, the sacrificial layer is removed to form a space between the second insulating layer and the second ILD layer, first insulating and first ILD layer, and a third insulating layer is formed over the source/drain contact and the second ILD layer to cap an upper opening of the space, thereby forming an air gap. In one or more of the foregoing and the following embodiments, the sacrificial layer includes amorphous or polycrystalline Si. In one or more of the foregoing and the following embodiments, the sacrificial layer includes a dielectric material different from the first and second ILD layer and the first and second insulating layers. In one or more of the foregoing and the following embodiments, the second insulating layer includes silicon nitride. In one or more of the foregoing and the following embodiments, the third insulating layer includes silicon nitride. In one or more of the foregoing and the following embodiments, the source/drain contact includes a liner contact layer and a body contact layer made of Co. In one or more of the foregoing and the following embodiments, before the source/drain contact is formed, a silicide layer is formed on the source/drain epitaxial layer.

In accordance with another aspect of the present disclosure, in method of manufacturing a semiconductor device, a source/drain epitaxial layer is formed over a substrate, a first interlayer dielectric (ILD) layer is formed over the source/drain epitaxial layer, a first insulating layer made of a different material than the first ILD layer is formed over the first ILD layer, a second ILD layer made of a different material than the first insulating layer is formed over the first insulating layer, a first opening passing through the second ILD layer, the first insulating layer and the first ILD layer is formed to at least partially expose the source/drain epitaxial layer, a sacrificial layer is formed on an inner wall of the first opening, a second insulating layer is formed on the sacrificial layer, a silicide layer is formed on the source/drain epitaxial layer, a conductive layer is formed on the second insulating layer so as to form a source/drain contact in contact with the silicide layer, the sacrificial layer is removed to form a space between the second insulating layer and the second ILD layer, first insulating and first ILD layer, and a third insulating layer is formed over the source/drain contact and the second ILD layer to cap an upper opening of the space, thereby forming an air gap. In one or more of the foregoing and the following embodiments, the sacrificial layer is a metal layer; and the silicide layer is formed from the metal layer by a thermal treatment. In one or more of the foregoing and the following embodiments, the metal layer is made of one of Ti, Co, W, Ta or Ru. In one or more of the foregoing and the following embodiments, the silicide layer is located below the air gap.

In accordance with another aspect of the present disclosure, a semiconductor device includes a gate structure, a source/drain structure including a source/drain epitaxial layer, dielectric layers disposed over the source/drain epitaxial layer, a source/drain contact passing through the dielectric layer and contacting the source/drain epitaxial layer, a liner insulating layer disposed on a side wall of the source/drain contact, and an air gap disposed between the liner insulating layer and the dielectric layers. In one or more of the foregoing and the following embodiments, the liner insulating layer is made of silicon nitride. In one or more of the foregoing and the following embodiments, the semiconductor device further includes a cap insulating layer disposed on an uppermost layer of the dielectric layers to cap the air gap, and a bottom of the cap insulating layer is located below a top of the source/drain contact. In one or more of the foregoing and the following embodiments, a piece of polycrystalline or amorphous Si is disposed at a bottom of the air gap. In one or more of the foregoing and the following embodiments, the air gap is in contact with the source/drain epitaxial layer. In one or more of the foregoing and the following embodiments, the air gap is disposed between the source/drain contact and the gate structure. In one or more of the foregoing and the following embodiments, the gate structure includes a metal gate electrode and gate sidewall spacers disposed on opposing side faces of the metal gate electrode, and one of the dielectric layers is disposed between the air gap and one of the gate sidewall spacers.

In accordance with another aspect of the present disclosure, a semiconductor device includes a gate structure, a source/drain structure including a source/drain epitaxial layer, a first insulating layer disposed on the source/drain epitaxial layer, a first interlayer dielectric (ILD) layer disposed on the first insulating layer, a second insulating layer disposed on the first ILD layer, a second ILD layer disposed on the second insulating layer, a source/drain contact passing through the second ILD layer, the second insulating layer, the first ILD layer and the first insulating layer and contacting the source/drain epitaxial layer, and a first air gap disposed between the source/drain contact and the second ILD layer, the second insulating layer and the first ILD layer. In one or more of the foregoing and the following embodiments, a liner insulating layer is disposed on a side wall of the source/drain contact. In one or more of the foregoing and the following embodiments, the liner insulating layer includes at least one of silicon nitride, SiON and SiOCN. In one or more of the foregoing and the following embodiments, the first and second insulating layer include silicon nitride. In one or more of the foregoing and the following embodiments, the semiconductor device further includes a cap insulating layer disposed on the second ILD layer to cap the air gap, and a bottom of the cap insulating layer is located below a top of the source/drain contact. In one or more of the foregoing and the following embodiments, a vertical distance between the bottom of the cap insulating layer and the top of the source/drain contact is 5-20% of a height of the source/drain contact. In one or more of the foregoing and the following embodiments, the cap insulating layer includes silicon nitride. In one or more of the foregoing and the following embodiments, a piece of polycrystalline or amorphous Si is disposed at a bottom of the air gap.

In accordance with another aspect of the present disclosure, a semiconductor device includes a gate structure, a source/drain structure including a source/drain epitaxial layer, a silicide layer disposed on the source/drain epitaxial layer, a first insulating layer disposed on the source/drain epitaxial layer, a first interlayer dielectric (ILD) layer disposed on the first insulating layer, a second insulating layer disposed on the first ILD layer, a second ILD layer disposed on the second insulating layer, a source/drain contact passing through the second ILD layer, the second insulating layer, the first ILD layer and the first insulating layer and contacting the source/drain epitaxial layer, a liner insulating layer disposed on a side wall of the source/drain contact, and a first air gap disposed between the source/drain contact and the liner insulating layer. In one or more of the foregoing and the following embodiments, the silicide layer penetrates below the liner insulating layer. In one or more of the foregoing and the following embodiments, the silicide layer penetrates below the air gap. In one or more of the foregoing and the following embodiments, a piece of metal is disposed at a bottom of the air gap. In one or more of the foregoing and the following embodiments, a metal element material of the piece of metal and a metal element of the silicide layer are the same.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a gate structure including a gate electrode disposed over a channel region;
a plurality of dielectric layers disposed over the channel region;
a gate contact passing through the plurality of dielectric layers and contacting the gate electrode;
a liner insulating layer disposed on a side wall of the gate contact; and
an air gap disposed between the liner insulating layer and the plurality of dielectric layers,
wherein a piece of polycrystalline or amorphous Si is disposed at a bottom of the air gap.

2. The semiconductor device of claim 1, wherein the liner insulating layer is made of silicon nitride.

3. The semiconductor device of claim 1, further comprising a cap insulating layer disposed on an uppermost layer of the plurality of dielectric layers to cap the air gap,
wherein a bottom of the cap insulating layer is located below a top of the gate contact.

4. The semiconductor device of claim 1, wherein the air gap passes through two or more dielectric layers of the plurality of dielectric layers.

5. The semiconductor device of claim 1, wherein:
the gate structure includes gate sidewall spacers disposed on opposing side faces of the gate electrode, and
the air gap contact one of the gate sidewall spacers.

6. The semiconductor device of claim 1, wherein the gate contact includes a conductive liner layer and a body metal layer disposed over the conductive liner layer.

7. The semiconductor device of claim 1, wherein a height of the piece of polycrystalline or amorphous Si is 1-5% of a height of the air gap.

8. A semiconductor device comprising:
a gate structure including a gate electrode;
a source/drain structure including a source/drain epitaxial layer;
a plurality of dielectric layers disposed over the source/drain epitaxial layer;
a source/drain contact passing through one or more of the plurality of dielectric layers and contacting the source/drain epitaxial layer;
a first liner insulating layer disposed on a side wall of the source/drain contact;
a first air gap disposed between the first liner insulating layer and the plurality of dielectric layers;
a gate contact passing through one or more of the plurality of dielectric layers and contacting the gate electrode;
a second liner insulating layer disposed on a side wall of the gate contact; and
a second air gap disposed between the second liner insulating layer and the plurality of dielectric layers,
wherein a piece of polycrystalline or amorphous Si is disposed at a bottom of the first air gap.

9. The semiconductor device of claim 8, wherein the first liner insulating layer is disposed on a side wall of the source/drain contact.

10. The semiconductor device of claim 8, wherein each of the first liner insulating layer and the second liner insulating layer includes at least one of silicon nitride, SiON and SiOCN.

11. The semiconductor device of claim 8, wherein:
the plurality of dielectric layers includes a first insulating layer disposed over the source/drain structure, a first interlayer dielectric (ILD) layer disposed over the first insulating layer, a second insulating layer disposed over the first ILD layer, a second ILD layer disposed over the second insulating layer, a third insulating layer disposed over the second ILD layer and a third ILD layer disposed over the third insulating layer.

12. The semiconductor device of claim 11, wherein:
the third insulating layer caps the first air gap, and
a bottom of the third insulating layer is located below a top of the source/drain contact.

13. The semiconductor device of claim 12, further comprising a fourth insulating layer disposed over the third ILD layer to cap the second air gap,
wherein a bottom of the fourth insulating layer is located below a top of the gate contact.

14. The semiconductor device of claim 13, wherein each of the third insulating layer and the fourth insulating layer includes silicon nitride.

15. The semiconductor device of claim 8, wherein a height of the piece of polycrystalline or amorphous Si is 1-5% of a height of the first air gap.

16. The semiconductor device of claim 8, wherein another piece of polycrystalline or amorphous Si is disposed at a bottom of the second air gap.

17. A semiconductor device comprising:
a source/drain structure including a source/drain epitaxial layer;
a plurality of dielectric layers disposed over the source/drain epitaxial layer;
a lower contact disposed in one or more of the plurality of dielectric layers and contacting the source/drain epitaxial layer;
a first liner insulating layer disposed on a side wall of the lower contact;
a first air gap disposed between the first liner insulating layer and the plurality of dielectric layers;
an upper contact disposed in one or more of the plurality of dielectric layers and contacting the lower contact;
a second liner insulating layer disposed on a side wall of the upper contact; and
a second air gap disposed between the second liner insulating layer and the plurality of dielectric layers,
wherein a piece of polycrystalline or amorphous Si is disposed at a bottom of the first air gap.

18. The semiconductor device of claim 17, further comprising a silicide layer disposed on the source/drain epitaxial layer,
wherein the silicide layer penetrates below the first liner insulating layer.

19. The semiconductor device of claim 17, further comprising a silicide layer disposed on the source/drain epitaxial layer,
wherein the silicide layer penetrates below the first air gap.

20. The semiconductor device of claim 17, wherein a height of the piece of polycrystalline or amorphous Si is 1-5% of a height of the first air gap.

* * * * *